United States Patent [19]
Yao et al.

[11] Patent Number: 6,051,114
[45] Date of Patent: Apr. 18, 2000

[54] USE OF PULSED-DC WAFER BIAS FOR FILLING VIAS/TRENCHES WITH METAL IN HDP PHYSICAL VAPOR DEPOSITION

[75] Inventors: Tse-Yong Yao, Sunnyvale; Zheng Xu, Foster City; Kenny King-tai Ngan, Fremont, all of Calif.; Xing Chen, Cambridge, Mass.; John Urbahn, Hampstead, N.H.; Lawrence P. Bourget, Reading, Mass.

[73] Assignee: Applied Materials, Inc., Santa Clara, Calif.

[21] Appl. No.: 08/880,467

[22] Filed: Jun. 23, 1997

[51] Int. Cl.⁷ .................................................. C23C 14/34
[52] U.S. Cl. ................................ 204/192.3; 204/192.12; 204/192.13; 204/192.17; 204/298.03; 204/298.06; 204/298.08; 204/192.15
[58] Field of Search ........................... 204/192.1, 192.12, 204/192.13, 192.15, 192.17, 192.32, 192.33, 298.01, 298.02, 298.03, 298.31, 298.32, 298.34, 298.38, 192.3, 298.06, 298.08

[56] References Cited

U.S. PATENT DOCUMENTS

| | | | |
|---|---|---|---|
| 4,756,810 | 7/1988 | Lamont, Jr. et al. | 204/192.3 |
| 4,963,239 | 10/1990 | Shimamura et al. | 204/192.12 |
| 4,999,096 | 3/1991 | Nihei et al. | 204/192.3 |
| 5,126,028 | 6/1992 | Hurwitt et al. | 204/192.13 |
| 5,302,266 | 4/1994 | Grabarz et al. | 204/192.12 |
| 5,303,139 | 4/1994 | Mark | 204/298.08 |
| 5,346,600 | 9/1994 | Nieh et al. | 204/192.3 |
| 5,639,357 | 6/1997 | Xu | 204/192.3 |
| 5,770,023 | 6/1998 | Sellers | 204/192.32 |

FOREIGN PATENT DOCUMENTS

| | | |
|---|---|---|
| 0 297 502 A3 | 1/1989 | European Pat. Off. . |
| 0 297 502 A2 | 4/1989 | European Pat. Off. . |

OTHER PUBLICATIONS

Holber et al. "Copper deposition by electron cyclotron resonance plasma," J. Vac. Sci. Technol. A 11(6), pp. 2903–2910, Dec. 1993.

Patent Cooperation Treaty PCT International Search Report, 6 pages.

Keizo Suzuki, Sadayuki Okudaira, Noriyuki Sakudo and Ichiro Kanomata, "Microwave Plasma Etching," Journal of Applied Physics, vol. 16, No. 11, Nov., 1977 pp. 1979–1984.

Keizo Suzuki, Ken Ninomiya and Shigeru Nishimatsu, "Microwave plasma etching," Pergamon Press Ltd., vol. 34/No. 10/11 pp. 953–957, 1984.

L. J. Kochel, "Pressure control of rf bias for sputtering," Rev. Sci. Instrum., vol. 47, No. 12, Dec., 1976, pp. 1555–1557.

S. Hamaguchi and S. M. Rossnagel, "Simulations of trench-lling pro les under ionized magnetron sputter metal deposition," J. Vac. Sci. Technol. B 13(2), Mar./Apr. 1995, pp. 183–191.

S.M. Rossnagel and R. Sward, "Collimated magnetron sputter deposition with grazing angle ion bombardment," J. Vac. Sci. Technol. A, vol. 13 No. 1. Jan./Feb. 1995, pp. 156–158.

(List continued on next page.)

*Primary Examiner*—Rodney McDonald
*Attorney, Agent, or Firm*—Thomason, Moser & Patterson

[57] ABSTRACT

The present invention provides a method and apparatus for preferential PVD conductor fill in an integrated circuit structure. The present invention utilizes a high density plasma for sputter deposition of a conductive layer on a patterned substrate, and a pulsed DC power source capacitively coupled to the substrate to generate an ion current at the surface of the substrate. The ion current prevents sticking of the deposited material to the field areas of the patterned substrate, or etches deposited material from the field areas to eliminate crowning or cusping problems associated with deposition of a conductive material in a trench, hole or via formed on the substrate.

20 Claims, 5 Drawing Sheets

OTHER PUBLICATIONS

Toshiaki Yasui, Hirokazu Tahara, and Takao Yoshikawa, "Electron cyclotron resonance plasma generation using a planar ring–cusp magnetic field and a reentrant coazial cavity," J. Vac. Sci. Technol. A 13(4), Jul./Aug. 1995, pp. 2105–2109.

I. S. Park, S. I. Lee, Y. J. Wee, W. S. Jung, G. H. Choi, C. S. Park, S. H. Park, S. T. Ahn, M. Y. Lee, Y. K. Kim and R. Reynolds, A Noval Al–Reflow Process Using Surface Modification by the ECR Plasma Treatment and Its Application to the 256Mbit DRAM, IEDM 94, 109–112, pp. 5.4.1–5.4.4, 1994.

W. M. Holber, J. S. Logan, H. J. Grabarz, J. T. C. Yeh, and J. B. O. Caughman, "Copper deposition by electron cyclotron resonance plasma," J. Vac. Sci. Technol. A 11(6), Nov./Dec. 1993 pp. 2903–2910.

Peter F. Cheng, and S. M. Rossnagel, "Directional deposition of Cu into semiconductor trench structures using ionized magnetron sputtering," J. Vac. Sci. Technol. B 13(2), Mar./Apr. 1995 pp. 203–208.

P. Kidd, "A magnetically confined and electron cyclotron resonance heated plasma machine for coating and ion surface modification use," J. Vac. Sci. Technol A. vol. 9 No. 3 May/Jun. 1991 pp. 466–473.

M. Yamashita, "Fundamental characteristics of built–in high–frequency coil–type sputtering apparatus, " J. Vac. Sci. Technol. A. 7(2), Mar./Apr. 1989, pp. 151–158.

Seiji Samukawa, "Wave propagation and plasma uniformity in an electron cyclotron reasonance plasma," J. Vac. Sci. Tecnol. A 11(5), Sep./Oct. 1993, pp. 2572–2576.

Christopher Apblett, Manuel F. Gonzales, J. Charles Barbour, Lisa–Marie Gonzales–Peterson, Matthew Kovacs, Bryan Kuhr, "Silicon nitride growth in a high–density plasma system," Nov. 1995 Solid State Technology pp. 73–74, 76, 78 and 80.

S. M. Gorbatkin, D. B. Poker, R. L. Rhoads, C. Doughty, L. A. Berry and S. M. Rossnagel, "Cu metallization using a permanent magnet electron cyclotron resonance microwave plasma/sputtering hybrid system," J. Vac. Sci. Technol. B 14(3), May/Jun. 1996, pp. 1853–1859.

Ward D. Getty, Joseph B. Geddes, "Size–scalable, 2.45 GHz electron cyclotron resonance plasma source using permanent magnets and waveguide coupling," J. Vac. Sci. Technol. B 12(1),Jan./Feb. 1994, pp. 408–415.

Seitara Matsuo, "Reactive Ion–Beam Etching and Plasma Deposition Techniques Using Eelctron Cyclotron Resonance Plasmas," Applied Solid State Science, Academic Press, Inc., 1985 pp. 75–117.

H. Koening and E. Stern, "RF Sputtering System with Variable Substrate Bias," IBM Technical Disclosure Bulletin vol. 13, No. 2 (Jul. 1970), pp. 323–324.

U. S. Patent application Entitled "Step Coverage and Overhang Improvement by Pedestal Bias Voltage Modulation, " Serial No. 08/989,759; filing Date Dec. 12, 1997; Inventor: Yoichiro Tanaka.

U.S. application No. 08/768,058, Ramaswani et al., filed Dec. 16, 1996.

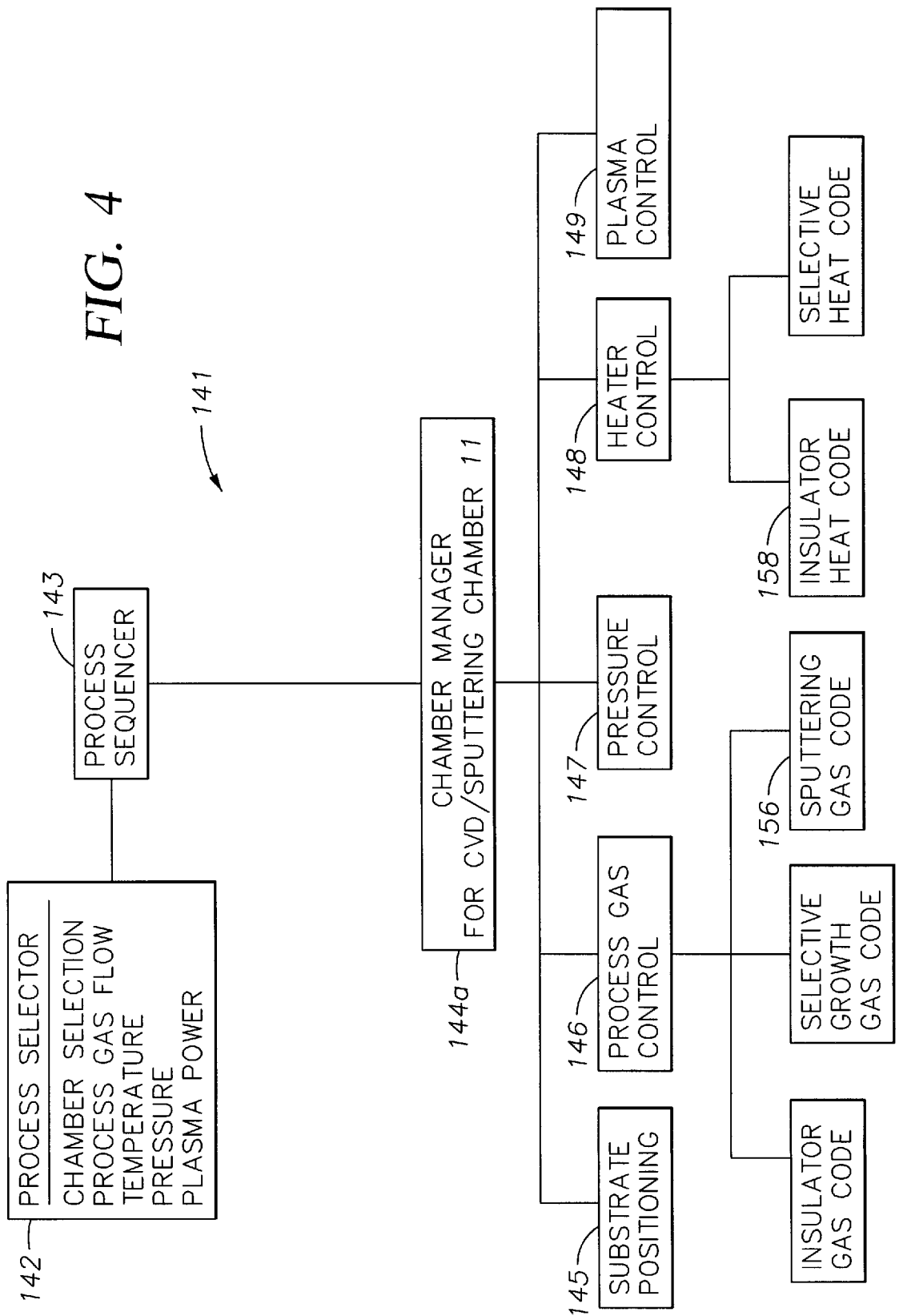

USE OF PULSED-DC WAFER BIAS FOR FILLING VIAS/TRENCHES WITH METAL IN HDP PHYSICAL VAPOR DEPOSITION

BACKGROUND OF THE INVENTION

1. Field of the Invention

The present invention relates generally to methods and apparatus for fabricating electronic devices on substrates, including integrated circuits. More particularly, the present invention relates to methods for selectively or preferentially depositing material in trenches, holes or vias formed in a substrate surface using physical vapor deposition (PVD) with a high density plasma

2. Background of the Related Art

Sputtering or physical vapor deposition is a known technique for depositing thin films onto a substrate. Typically in a sputtering system, a glow discharge plasma is generated in an atmosphere of inert gas by maintaining an inert gas atmosphere at a low pressure between a two electrode system comprising a cathode and an anode. A plasma is created in the space between the electrodes in which the inert gas atmosphere becomes at least partially ionized. The plasma is bounded from each of the electrodes by a plasma sheath or dark space. A high negative potential applied to the cathode (with respect to the plasma) then accelerates ions from the plasma onto the cathode (usually the target or desired coating material) where cascade lattice collisions cause the ejection of neutral target atoms. At gas pressures below about 10 milliTorr, the ejected or sputtered atoms travel across the plasma, essentially without interaction, and deposit on the anode which may comprise the substrate or wafer to be coated. At higher gas pressures from about 10 milliTorr to about 50 milliTorr, the sputtered neutral atoms can interact with the plasma while traversing therethrough. This results in a nearly isotropic directional distribution of the sputtered material at the surface of the wafer or substrate.

The surface of the wafer being coated is typically patterned and frequently includes high aspect ratio apertures and vias wherein the ratio of depth to width is greater than 4:1. Apertures or vias are formed in a substrate to provide a conductive path (trench) or contact (hole) between film layers. PVD is a preferred technique for coating substrates with metals. However, as geometries shrink it becomes more difficult to fill high aspect ratio features without forming voids in the feature. As deposition material is deposited in the aperture and on the field of the substrate, the aperture is closed in a phenomenon known as "crowning" where the deposited material closes the top of the aperture before it has been completely filled. Material is deposited on the areas between the holes and trenches, commonly referred to as the "field" of the wafer, and closes the openings of the small features. Generally, it is desired to have little or no metallic or conductive coatings on field areas of the wafer, at least in the same plane as the top of the trenches or holes forming conductive paths or contacts. The build up of material on the field adjacent a hole or trench leads to the problem of "shadowing" in which an overhanging edge of such material can shield or deflect sputtered material from reaching the sidewalls and floor of the hole or trench. Thus, it is difficult to selectively or preferentially fill the trenches, vias, or holes without covering the field areas.

Ionized PVD uses a high density plasma between a sputtering target and a substrate to ionize a high fraction of sputtered atoms before depositing onto the substrate. These ions are accelerated perpendicularly towards the surface of the substrate within a plasma sheath, improving the selective or preferential filling of high aspect ratio holes, trenches, or vias.

Biasing of the substrate relative to plasma potential is widely used in ionized PVD to control the energy of ions reaching the substrate and improve results. The bias voltage can be applied directly with a conductive substrate or a conductive layer on the substrate. With a non-conductive or highly resistive substrate, RF bias voltage can be capacitively coupled to the substrate. The frequency of the RF bias is typically between 10 Kilohertz and 300 Megahertz depending on the time duration in which the substrate surface is significantly charged by the electric currents from plasma. However, conventional sinusoidal RF bias does not accurately control the energy of ions reaching the substrate surface because of variations in bias voltage during each cycle.

SUMMARY OF THE INVENTION

The present invention provides a method and apparatus for preferentially depositing conductive coatings in holes, trenches or vias to the exclusion or diminution of deposition on field areas on a substrate. The present invention utilizes a high density plasma source, such as an Electron Cyclotron Resonance (ECR) reactor, to generate ions, and utilizes a pulsed DC substrate bias to accurately control ion flux to eliminate crowning or cusping problems associated with deposition on the field of a patterned substrate. The invention provides preferential deposition of a conductive material in a trench, hole or via formed on the substrate.

The pulsed DC bias method uses a pulsed voltage waveform to provide a nearly constant voltage bias to a substrate surface to control the ion flux. The use of a high density plasma source and separate bias power sources applied to the target and the substrate support member (and capacitively coupled to the substrate) enable the target to be sputtered without sticking of the target material deposited on the field areas of the substrate, or with repeated etching of the target material deposited on the field areas. One advantage of this method and apparatus is that the deposition of the film on the field of the substrate can be controlled to prevent the openings of small features patterned on substrates from crowning before the feature has been adequately filled with deposition material.

In one embodiment of the present invention, a uniform barrier layer is formed over the entire surface of the substrate using, for example, conventional chemical vapor deposition or sputtering techniques. The barrier layer is generally a metallic nitride or oxide and is a conductor or semiconductor compared to the preferred deposition material used in vias, interconnects or lines having high aspect ratios. A conducting layer is then preferentially deposited over the barrier layer using the DC pulsed substrate bias techniques of the present invention. Preferential deposition allows the bottom and steep sidewalls of the holes, trenches or vias to be coated without the problems of shadowing caused by crowning or cusping of the film deposited on the field adjacent the feature opening. Deposition of material continues until the feature is completely filled, optimally leaving little or no conductor deposition on the field areas.

The techniques of the present invention are preferably performed with an Electron Cyclotron Resonance (ECR) plasma generator with an inert gas atmosphere at a pressure between 0.1 to 5 milliTorr to preferentially fill the holes, trenches or vias. In this instance, microwave and pulsed DC bias levels, barrier layer material, and metal ionization fraction are adjusted to provide preferential filling of the high aspect ratio features.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

FIG. 4 is a flow diagram of a computer program for controlling the process and apparatus of the present invention.

DESCRIPTION OF THE PREFERRED EMBODIMENT

High density plasma (HDP) physical vapor deposition (PVD) is a useful tool in coating substrates or wafers of semiconductors used in fabricating microelectronic circuits. In HDP-PVD, an inert gas atmosphere is maintained at a pressure of about 0.1 to about 50 milliTorr in a vacuum chamber having a target and a wafer or substrate to be coated during sputtering of the target.-The preferential deposition method of this invention can be performed in any HDP-PVD apparatus such a magnetron sputtering system which uses an inductively coupled plasma source or an electron cyloctron resonance system which uses a microwave plasma source. The ECR system is preferred since it provides higher metal ionization fraction, 50% to 100%, and a lower pressure regime for preferential deposition. The metal ionization fraction is directly controlled by increasing or decreasing microwave energy used in plasma generation.

Figure 1:
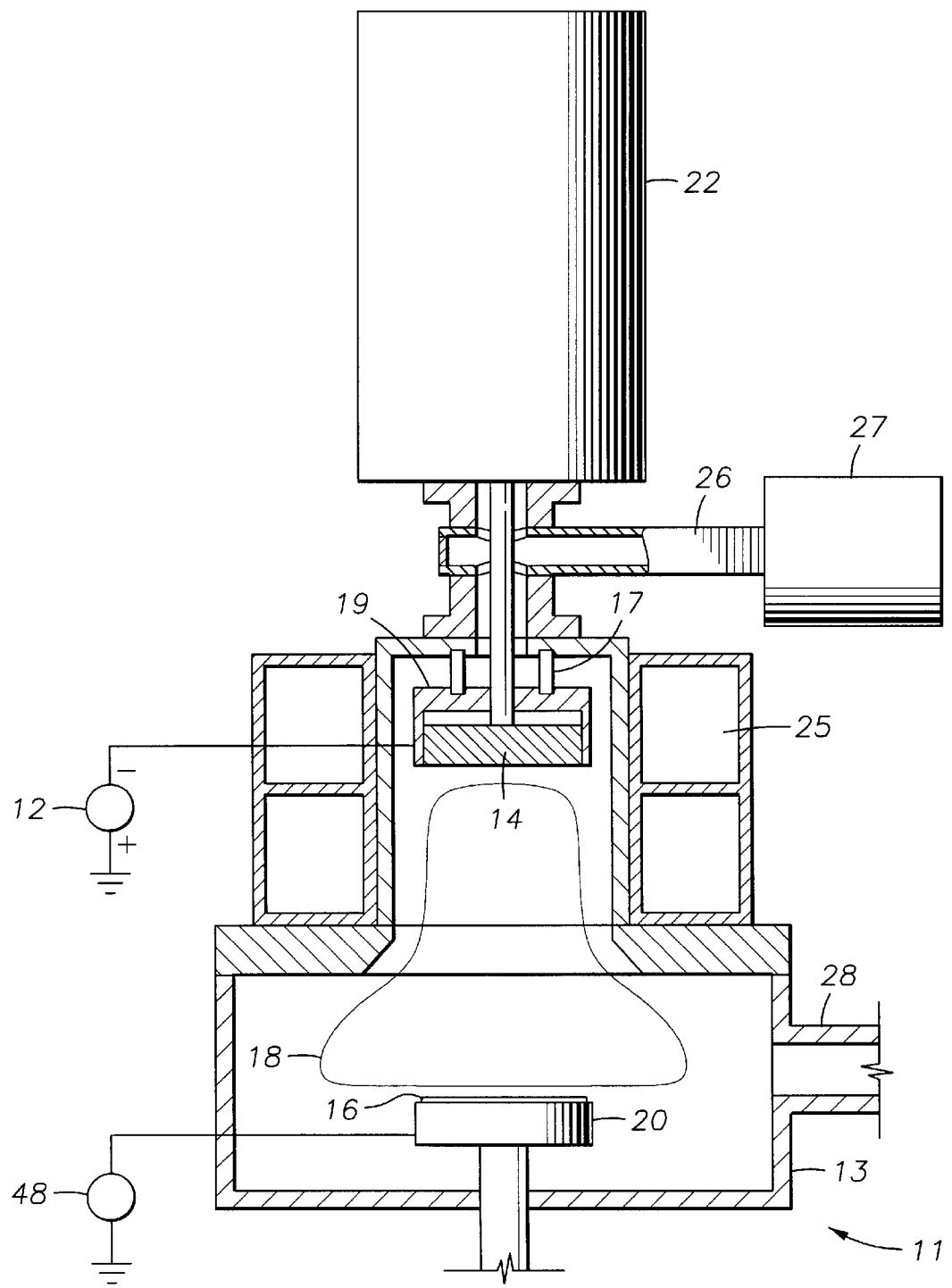
FIG. 1 is a schematic diagram of a preferred ECR microwave plasma chamber for preferentially filling vias/trenches in a patterned substrate with a conductive material.

FIG. 1 is a schematic drawing showing an ECR chamber 11 having an exhaust outlet port 28 for exhausting process gases. A substrate support pedestal 20, which supports a substrate 16 during processing in the chamber 11, is disposed at the lower end of the chamber 11. A target 14 which comprises a material to be deposited on the substrate 16 is received at the upper end of the chamber 11. Target 14 is electrically insulated from the wall 13 of chamber 11 to receive a negative bias which assists in forming a plasma of process gases. The support pedestal 20 which may be heated by internal coils or the like (not shown) to increase the processing temperature. An inert gas, such as argon (Ar), is typically used to maintain within the chamber a processing pressure between about 0.1 mT and about 5 mT.

The target 14 is a conductive material which is sputtered to fill trenches/vias in a patterned substrate 16. The conductive material is preferably aluminum or copper, but may be any conductive material useful in the fabrication of integrated circuits. Preferential deposition occurs when the substrate 16 is raised by the support pedestal 20 into a processing region 18. A target connection assembly 22 provides cooling and electric connection to the target 14. The processing region 18 is typically water cooled and is surrounded by magnets 25 which create a magnetic field which enables efficient microwave absorption. Microwaves are provided through a waveguide 26 by an external microwave source 27. The waveguide 26 is typically a square tube which channels microwave power to an annular microwave window 17 above the processing region 18. A dark space shield 19 protects the microwave window 17 from particles sputtered from the target 14.

The microwave energy applied to the processing region 18 within the magnetic field causes a plasma (glow discharge) to form in the inert gas disposed between the substrate 16 and the target 14. A high negative potential is applied to the target 14 by a power supply 12 which can be a DC or RF power supply. A pulsed negative potential is further supplied to the substrate holder 20 by pulsed DC power supply 48 which alternately accelerates the deposition flux toward the substrate or discharges positive charges built up on the substrate. The negative potential accelerates ions which are deposited in the hole, trench, or via, as well as ions which bombard the field of the substrate.

The pulsed DC bias method uses a pulsed voltage waveform to provide a nearly constant voltage bias to a substrate surface that is in contact with a plasma. The constant voltage provides uniform ion acceleration, thereby obtaining uniform ion energy at the substrate surface with a narrow energy distribution. The ion energy at the substrate surface is interrupted briefly when the pulsed DC waveform cycles to a slight positive voltage to remove charges building at the substrate surface. Brief interruption of the ion current to the substrate is sufficient during each cycle because the charge building on the substrate is removed by electron current from the plasma which is typically tens to hundreds of times greater than ion current from the plasma.

Figure 2:
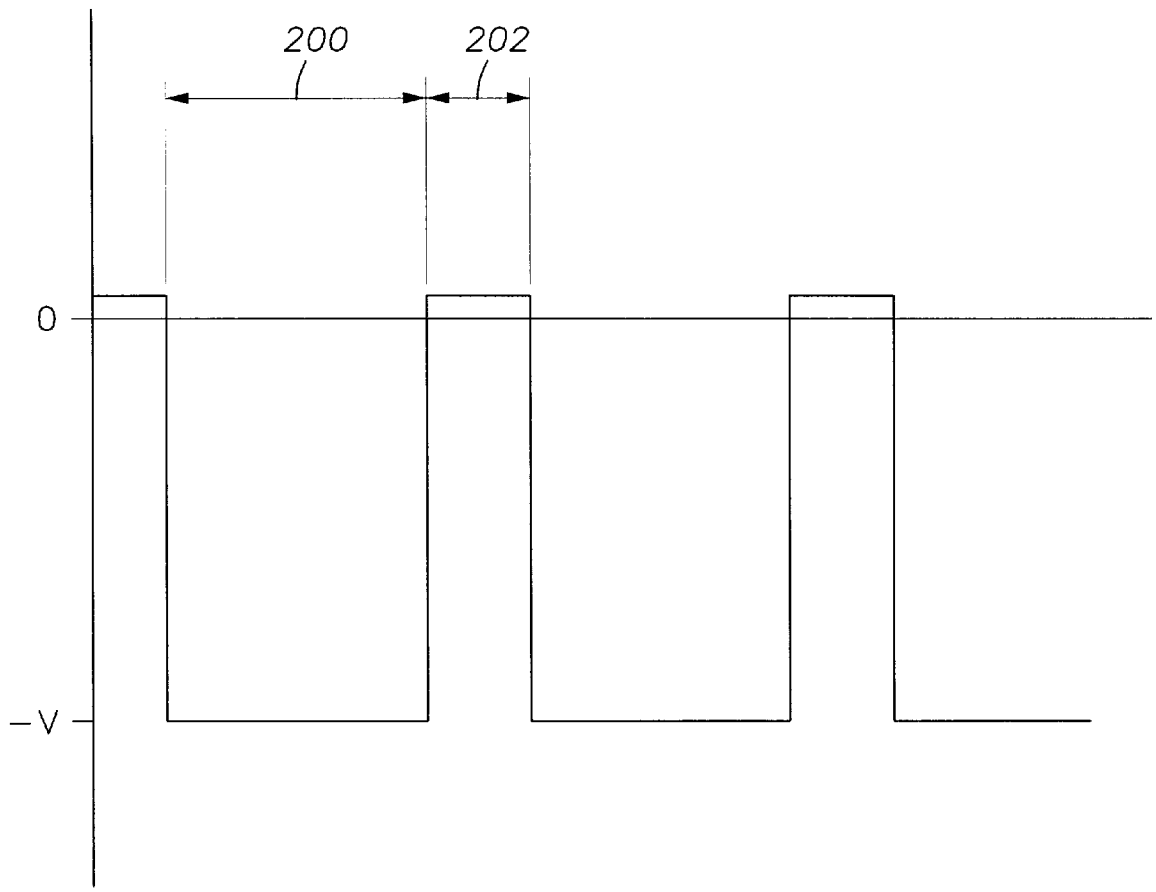
FIG. 2 is a schematic representation of a preferred pulsed DC waveform for biasing a substrate in the plasma chamber of FIG. 1.

FIG. 2 shows a preferred DC pulsed bias waveform for preferentially depositing a conductor in holes, trenches, and vias. As shown in FIG. 2, a zero net average current is preferably applied to a substrate surface, which is preferred for any capacitively coupled bias. The zero net average current is achieved by using a bias voltage waveform in which the negative pulse 200 comprises most of the cycle and the duration of the positive pulse 202 is a small fraction, 0.1–30%, of the total pulse cycle. The pulsed voltage varies between a negative substrate bias –V ranging from –20 V to –200 V and a slightly positive substrate floating potential. The pulse cycle is selected so that the substrate surface will not be significantly charged by the current during a cycle.

The glow discharge plasma formed in processing region 18 between the target 14 and the substrate 16 is separated from the target 14 by a dark space or plasma sheath near the target and a dark space or plasma sheath near the substrate 16. The plasma contains partially ionized positive argon ions, neutral argon atoms, and sputtered target ions. The ionized positive argon ions are attracted to the target and accelerated across the dark space to the target 14 by the high negative potential provided by the power supply 12. When the fast moving ions hit the target 14, lattice A cascade reactions occur which eject neutral target atoms toward the substrate holder 20 supporting the substrate 16 to be coated.

The use of a high density plasma (HDP) at pressures between about 0.1 and 5 milliTorr is preferred in the techniques of the present invention. For a given set of sputtering and etching conditions, such as the target/substrate geometry, type of inert gas, target material, and optional barrier layer, an optimum pressure regime can be determined to perform the conductor hole or trench filling techniques to be described. The preferred substrate material in the semiconductor industry is silicon, usually in crystalline form.

When depositing metals, particularly aluminum (Al) or copper (Cu), onto a crystalline silicon substrate, it is generally necessary to first deposit a barrier layer over the substrate in order to prevent unwanted metallic "doping" or diffusion of the metal ions or atoms into the substrate lattice. Physical vapor deposition techniques have been used for this purpose and typically metal nitrides or oxides have been used for this barrier layer. A commonly used barrier layer for aluminum is titanium nitride (TiN), tantalum nitride (TaN) or any one of several other barrier layers can be used.

Figure 3A:
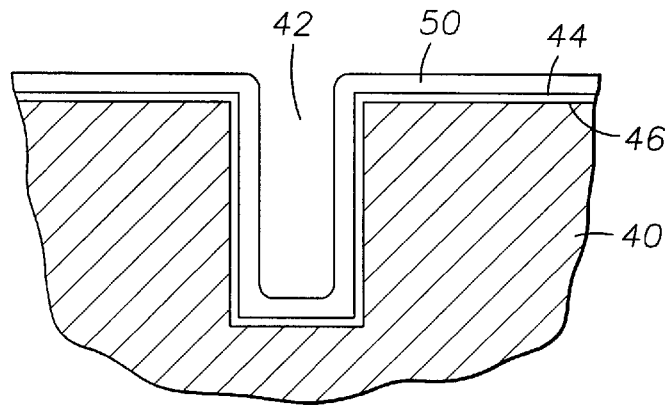
FIGS. 3A–3F are cross-sectional schematic diagrams showing how a hole or trench in a substrate is preferentially filled with a conductor while field areas remain free of the conductor.

FIG. 3A is a schematic sectional view of a substrate 40 having a hole or trench 42 previously etched in its surface and in which it is desired to preferentially fill with a conductor (usually metal) to form a contact point or a low resistance electrical current path in an integrated circuit being fabricated on the substrate 40. According to the techniques of the present invention, the substrate 40 is preferably processed in an appropriate chamber to first deposit a barrier layer 44 over the substrate 40, including the sidewall and bottom of the hole 42, to improve chip performance. The uniformity of barrier film layers is improved by controlling the substrate temperature to eliminate hot spots and cold spots, by rotation or other physical motion of the substrate during the deposition process to obtain average deposition rates across the substrate, and by use of higher gas pressures to provide more disperse deposition. The uniformity of the PVD layers is also enhanced by maintaining a substantially constant distance between the substrate and a target as described in U.S. patent application Ser. No. 08/092,847, filed Jul. 16, 1993, now U.S. Pat. No. 5,540,821 which disclosure is incorporated by reference herein. Any and all such techniques may be employed in accordance with the present invention to achieve uniform conformal coating in the steps requiring such for the process of filling holes or trenches with a conductive metal.

Once the barrier layer 44 of desired thickness has been deposited in the hole or trench 42 and on the field area 46 of the substrate 40, the technique of preferential deposition is begun to deposit a metal layer 50 over the hole surfaces of the barrier layer 44. Material deposited on the field area 46 of the substrate 40 has a lower probability of sticking as described below, or is etched away to prevent build-up on the field and around the top of the hole or trench.

Figure 3B:
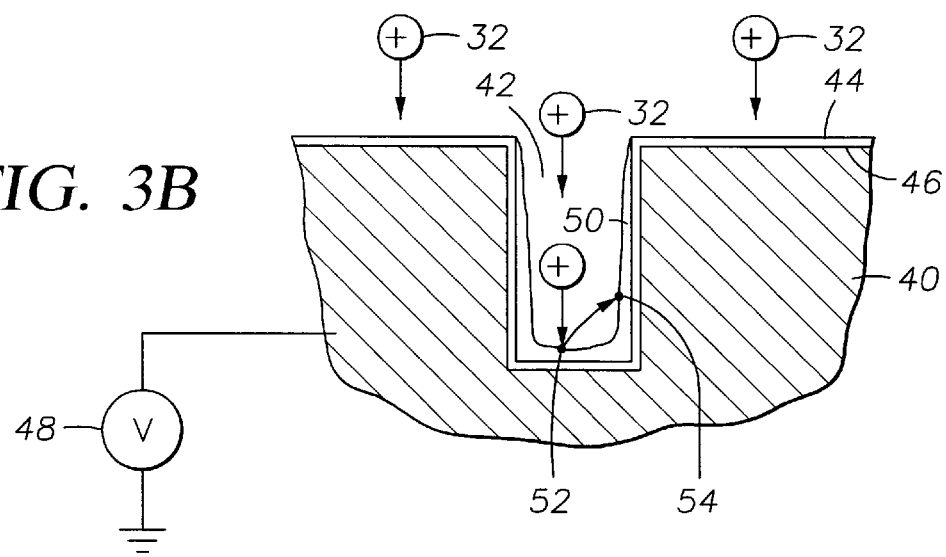

FIG. 3B schematically shows that the pulsed DC power supply 48 is capacitively coupled to the substrate 40 to apply a negative bias to the barrier layer 44 and any metal layer 50 deposited thereon. The negative bias applied to the substrate 40 attracts ions 32 from the plasma which are accelerated across a plasma sheath above the substrate and impinge on the metal layer 50 essentially in a vertical direction. This process reduces the sticking probability of metal ions impinging on the substrate surface and causes etching and re-sputtering of the previously deposited metal layer 50 by action of the impacting ions 32. Neutral metal atoms are etched away from metal layer 50 lying over the field area 46. However, in the hole or trench 42, the vertically impinging ions 32 cause resputtering of atoms from the metal layer 50 (such as from point 52), which are primarily preferentially deposited on the walls of the trench or hole 42 (such as at point 54). Accordingly, by preventing the deposition of the metal on the field areas 46, or by etching the deposited metal layer 50 from the field areas 46, the problem of shadowing the hole, which often results in the formation of voids, is eliminated. This allows the hole or trench 42 to become filled with the deposited metal. Optimally, the preferential deposition process stops once the hole, trench, or via is filled. When a conductive barrier layer is used, an appropriate end point to preferential deposition can be determined from a decrease in the sheet resistance of the barrier layer.

Figure 3C:
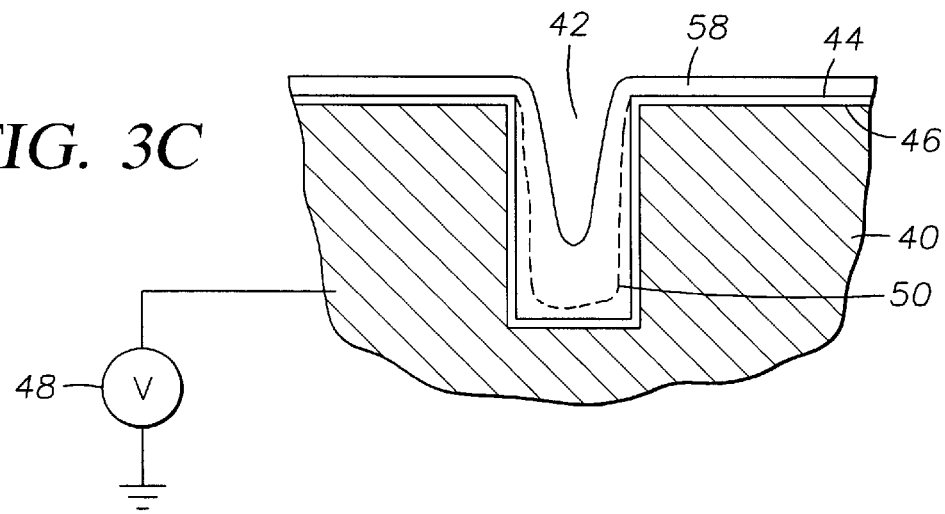
Figure 3D:
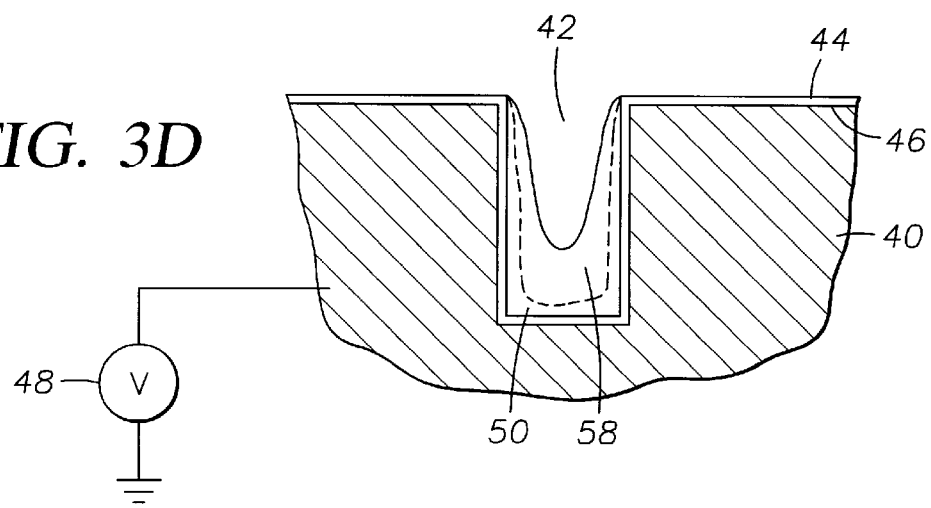
Figure 3E:
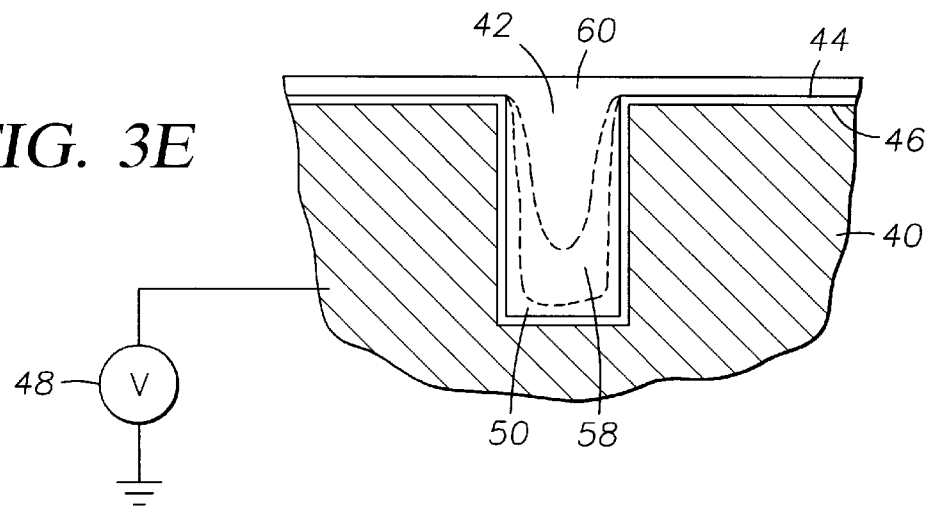
Figure 3F:
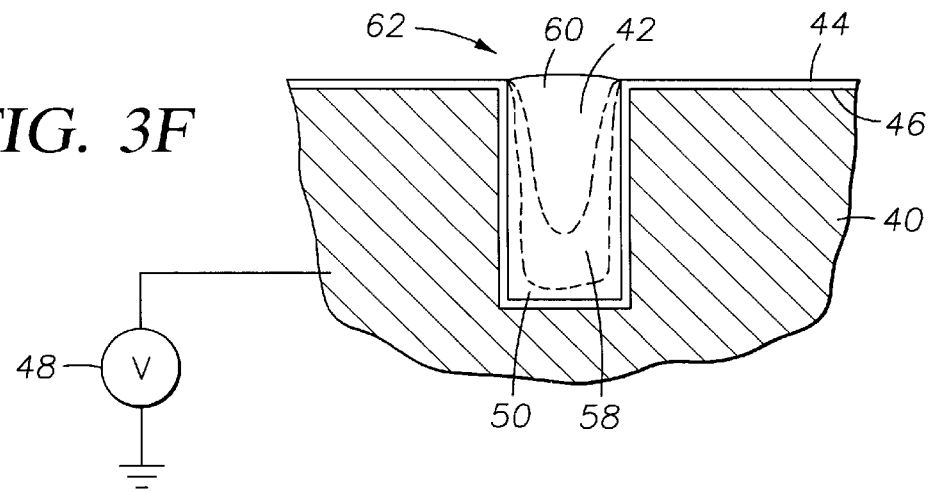

FIGS. 3C and 3D, as well as FIGS. 3E and 3F, show how the hole or trench 42 can be filled with a metal plug 62 by continued preferential deposition. The sequential layers 50, 58, 60 combine to selectively or preferentially form a metal plug 62 having no voids therein It will be recognized that the process of hole filling may be a single step or may include any number of cycles between sputtering and etching, with each step having the same or different durations or conditions.

Furthermore, when using high density plasma (HDP) PVD, the bias level placed on the substrate by the pulsed DC power source 48, vis-a-vis the negative voltage applied to the target 14, can be tailored to achieve sputtering of metal onto the field 46 and trench 42 while simultaneously removing the metal layer formed on the field 46 by bombardment with ions 32. Using the microwave source, an inductive coil, or antenna to maintain the plasma, the bias levels on the target 14 can be tailored so that sputtering of the target occurs at a faster rate than etching of the field areas 46 on the substrate. Buildup of the metal on the field is acceptable, so long as the net deposition rate on the field is sufficiently small as compared to the deposition rate in the trench, thereby preventing bridging of the metal over the trench before the trench is filled.

The process can be implemented using a computer program product 141 that runs on a conventional computer system comprising a central processor unit (CPU) interconnected to a memory system with peripheral control components, such as for example a 68400 microprocessor, commercially available from Synenergy Microsystems, California. The computer program code can be written in any conventional computer readable programming language such as for example 68000 assembly language, C, C++, or Pascal. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled windows library routines. To execute the linked compiled object code, the system user invokes the object code, causing the computer system to load the code in memory, from which the CPU reads and executes the code to perform the tasks identified in the program.

FIG. 4 shows an illustrative block diagram of the hierarchical control structure of the computer program 141. A user enters a process set and process chamber number into a process selector subroutine 142. The process sets are predetermined sets of process parameters necessary to carry out specified processes in a specific process chamber, and are identified by predefined set numbers. The process parameters relate to process conditions such as, for example, process gas composition and flow rates, temperature, pressure, plasma conditions such as microwave power levels and magnetic field power levels, cooling gas pressure, and chamber wall temperature.

A process sequencer subroutine 143 comprises program code for accepting the identified process chamber and set of process parameters from the process selector subroutine 142, and for controlling operation of the various process chambers. Multiple users can enter process set numbers and process chamber numbers, or a user can enter multiple process set numbers and process chamber numbers, so the sequencer subroutine 143 operates to schedule the selected processes in the desired sequence. Preferably the sequencer subroutine 143 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, the sequencer subroutine 143 can be designed to take into consideration the present condition of the process chamber being used in comparison with the desired process conditions for a selected process, or the "age" of each particular user entered request, or any other relevant factor a system programmer desires to include for determining scheduling priorities.

Once the sequencer subroutine 143 determines which process chamber and process set combination is going to be executed next, the sequencer subroutine 143 causes execution of the process set by passing the particular process set parameters to chamber manager subroutines 144a which control multiple processing tasks in different process chambers according to the process set determined by the sequencer subroutine 143. For example, the chamber manager subroutine 144a comprises program code for controlling PVD process operations, within the described process chamber 11. The chamber manager subroutine 144a also controls execution of various chamber component subroutines or program code modules, which control operation of the chamber components necessary to carry out the selected process set. Examples of chamber component subroutines are substrate positioning subroutine 145, process gas control subroutine 146, pressure control subroutine 147, heater control subroutine 148, and plasma control subroutine 149. These different subroutines function as deposition program code means for (a) generating a glow discharge in an inert gas atmosphere in the space between a target and a patterned substrate to be processed; (b) depositing a conductive material layer on the substrate; (c) applying a pulsed DC negative bias, with respect to the glow discharge plasma, to the substrate to be treated to attract ions from the plasma to the substrate while continuing to deposit the conductive material. Those having ordinary skill in the art would readily recognize that other chamber control subroutines can be included depending on what other processes are desired to be performed in the process chamber 11.

In operation, the chamber manager subroutine 144a selectively schedules or calls the process component subroutines in accordance within the particular process set being executed. The chamber manager subroutine 144a schedules the process component subroutines similarly to how the sequencer subroutine 143 schedules which process chamber 11 and process set is to be executed next. Typically, the chamber manager subroutine 144a includes steps of monitoring he various chamber components, determining which components needs to be operated based on the process parameters for the process set to be executed, and causing execution of a chamber component subroutine responsive to the monitoring and determining steps.

Operation of particular chamber component subroutines will now be described. The substrate positioning code or subroutine 145 comprises program code for controlling chamber components that are used to load the substrate 16 onto the substrate support 20, and optionally to lift the substrate to a desired height in the chamber 11 to control the spacing between the substrate and the target 14. When a substrate 16 is loaded into the process chamber 11, the substrate support 20 is lowered to receive the substrate, and thereafter, the support is raised to the desired height in the chamber. The substrate positioning subroutine 145 controls movement of the support 20 in response to the process set parameters related to the support height that are transferred from the chamber manager subroutine 144a.

The process gas control subroutine 146 has program code for controlling process gas composition and flow rates. Generally, the process gases supply lines for each of the process gases, include (i) safety shut-off valves (not shown) that can be used to automatically or manually shut off the flow of process gas into the chamber, and (ii) mass flow controllers (also not shown) that measure the flow of a particular gas through the gas supply lines. When toxic gases are used in the process, the several safety shut-off valves are positioned on each gas supply line in conventional configurations. The process gas control subroutine 146 controls the open/close portion of the safety shut-off valves, and also ramps up/down the mass flow controllers to obtain the desired gas flow rate. The process gas control subroutine 146 is invoked by the chamber manager subroutine 144a, as are all chamber component subroutines, and receives from the chamber manager subroutine process parameters related to the desired gas flow rates. Typically, the process gas control subroutine 146 operates by opening the gas supply lines, and repeatedly (i) reading the necessary mass flow controllers, (ii) comparing the readings to the desired flow rates received from the chamber manager subroutine 144a, and (iii) adjusting the flow rates of the gas supply lines as necessary. Furthermore, the process gas control subroutine 146 includes steps for monitoring the gas flow rates for unsafe rates, and activating the safety shut-off valves when an unsafe condition is detected.

The process gas control subroutine 146 comprises hole filling program code for operating the chamber in a selective or preferential hole filling mode. In the preferential hole filling mode, the sputtering gas program code 156 can also be provided to introduce sputtering gas into the PVD chamber 11 during performance of the PVD process step. As discussed above, the desired process gas flow rates are transferred to the process gas control subroutine 146 as process parameters. C. When the pressure control subroutine 147 is invoked, the desired or target pressure level is received as a parameter from the chamber manager subroutine 144a. The pressure control subroutine 147 operates to measure the pressure in the chamber 11 by reading one or more conventional pressure manometers connected to the chamber, compare the measure value(s) to the target pressure, obtain PID (proportional, integral, and differential) values from a stored pressure table corresponding to the target pressure, and adjust the throttle valve according to the PID values obtained from the pressure table. Alternatively, the pressure control subroutine 147 can be written to open or close the throttle valve to a particular opening size to regulate the chamber 11 at the desired pressure.

The heater control subroutine 148 comprises program code for controlling the temperature of the substrate support 20 used to heat the substrate 16. The heater control subroutine 148 includes hole filling program code 158 for operating in a hole filling stage in which the substrate is maintained at a desired temperatures T within the range of temperatures ΔT. Typically, the subroutine 148 is programmed to ramp up the temperature of the support from ambient chamber temperatures to a set point temperature. In this step, the heater control subroutine 148 is invoked by the chamber manager subroutine 144a and receives a ramp rate temperature parameter.

The heater control subroutine 148 measures temperature by measuring voltage output of a thermocouple located in the support, compares the measured temperature to the set point temperature, and increases or decreases current applied to the substrate holder 20 to obtain the desired ramp rate or set point temperature. The temperature is obtained from the measured voltage by looking up the corresponding temperature in a stored conversion table, or by calculating the temperature using a fourth order polynomial. When radiant lamps are used as the heater, the heater control subroutine 148 gradually controls a ramp up/down of current applied to the lamp that increases the life and reliability of the lamp. Additionally, a built-in fail-safe mode can be included to detect process safety compliance, and to shut down operation of the heater if the process chamber 11 is not properly set up.

The plasma control subroutine 149 comprises program code for forming a plasma in the chamber during operation of the chamber. The subroutine 149 sets the microwave power level applied, and optionally sets the level of the magnetic field generated in the chamber, to form the sputtering plasma. Similar to the previously described chamber component subroutines, the plasma control subroutine 149 is invoked by the chamber manager subroutine 144a. The read power levels are compared against target levels, and the current is adjusted to control the plasma A second plasma control subroutine 149 may be employed to control the pulsed DC power source 48 capacitively coupled to the substrate holder 20 to form a bias thereon. This power source can be used to generate an ion flux sufficient to re-sputter the field of the substrate. Alternatively, the power source may be used simultaneously with the power source 12. This second plasma control subroutine 149 may monitor the electric field potential or resistance at the surface of the barrier layer 44 and determine the end point of the etching process.

EXAMPLE

The method of the present invention was conducted on a patterned 8 inch silicon wafer plasma chamber which is substantially represented by FIG. 1. The chamber was evacuated to a base pressure of $3 \times 10^{-7}$ Torr and then filled with argon to a process pressure of about 0.85 mTorr to about 1.5 mTorr. A high negative voltage of 800 V was applied to an aluminum target with a target current of 2 Amps. Upper chamber magnets were powered with 230 Amps and lower chamber magnets were powered with 180 Amps. Microwave energy was supplied to the chamber at 4 KW from an external source as described for FIG. 1. A pulsed DC bias was capacitively coupled to the substrate as shown in FIG. 1 at a maximum voltage of −40 V and a frequency of 30.5 MHz. Deposition/etching was maintained for 40 minutes and aluminum completely filled the vias/trenches in the substrate without voids.

Similar process conditions were also used with RF biasing of the substrate and with DC biasing of the substrate. RF biasing of the substrate provided non-uniform ion acceleration and left substantial voids in the vias/trenches. DC biasing was also ineffective in preventing voids except around the edges of the substrate since DC current was not easily provided to the center of the substrate.

While the foregoing is directed to the preferred embodiment of the present invention, other and further embodiments of the invention may be devised without departing from the basic scope thereof, and the scope thereof is determined by the claims which follow.

We claim:

1. A method for filling one or more features on a substrate having a field area with a conductive material, comprising:
   (a) generating a glow discharge in an inert gas atmosphere between a target and a patterned substrate to be processed;
   (b) applying a negative DC bias to the target and a pulsed DC bias to the substrate having a DC positive voltage portion and a DC negative voltage portion to preferentially deposit a conductive material into the one or more features.

2. The method of claim 1 wherein the pulsed DC bias has a maximum negative voltage from about −20 V to about −200 V and a positive voltage from about 0.1 to about 30% of a total cycle.

3. The method of claim 1 wherein a barrier layer is deposited on the patterned substrate prior to applying the pulsed DC bias to the substrate.

4. The method of claim 1 wherein the conductive material comprises aluminum or copper.

5. The method of claim 1 wherein the conductive material is etched from field regions on the substrate.

6. The method of claim 1 wherein the inert gas atmosphere has a pressure from about 0.1 to about 1.5 mTorr.

7. A method for filling one or more features on a substrate having a field area with a conductive material, comprising:
   (a) depositing a barrier layer on the substrate;
   (b) generating a glow discharge in an inert gas atmosphere at a pressure from about 0.1 to about 5 mTorr between a target and the barrier layer by applying a negative bias to the target: while
   (c) applying a pulsed DC bias having a DC positive voltage portion and a DC negative voltage portion to the substrate at a maximum negative voltage from about −20 V to about −200 V to preferentially deposit aluminum or copper within the one or more features.

8. The method of claim 7, wherein the pulsed DC bias has a positive voltage from about 0.1 to about 30% of a total cycle.

9. The method of claim 7 wherein the glow discharge is generated by microwave power.

10. The method of claim 7 wherein the aluminum or copper is etched from field areas on the substrate.

11. An apparatus for filling one or more features on a substrate having a field area with a conductive material, comprising:
   (a) a processing chamber which generates a glow discharge in an inert gas atmosphere between a target and a patterned substrate to be processed by a negative bias generator capacitively coupled to the target;
   (b) a pulsed DC bias generator capacitively coupled to the substrate; and
   (c) a system controller programmed to control application of a pulsed DC bias having a DC positive voltage portion and a DC negative voltage portion to the substrate with the pulsed DC bias generator to preferentially deposit a conductive material into the one or more features on the patterned substrate.

12. The apparatus of claim 11, wherein the pulsed DC bias generator provides a maximum negative voltage from about −20 V to at −200 V and a positive voltage from about 0.1 to about 30% of a total cycle.

13. The apparatus of claim 11, wherein the system controller is programmed to deposit a barrier layer on the patterned substrate prior to applying pulsed DC bias to the substrate.

14. The apparatus of claim 11, wherein the conductive material comprises aluminum or copper.

15. The apparatus of claim 11, wherein the system controller is programmed to etch conductive material deposited on field regions on the substrate.

16. The apparatus of claim 11, wherein the glow discharge is generated in an inert gas atmosphere having a pressure from about 0.1 to about 1.5 mTorr.

17. An apparatus for filling one or more features on a substrate having a field area with a conductive material, comprising:
   (a) a processing chamber which generates a glow discharge in an inert gas atmosphere at a pressure from about 0.1 to about 5 mTorr between a target and a patterned substrate to be processed by applying a negative bias to the target;
   (b) a pulsed DC bias generator capacitively coupled to the substrate at a maximum negative voltage from about −20 V to about −200 V; and
   (c) a system controller programmed to deposit a barrier layer on a patterned dielectric layer on a substrate, and to apply a pulsed DC bias having a DC positive voltage portion and a DC negative voltage portion to the substrate with the pulsed DC bias generator to preferentially deposit a conductive material into the features on the patterned substrate.

18. The apparatus of claim 17 wherein the pulsed DC bias generator has a positive voltage from about 0.1 to about 30% of a total cycle.

19. The apparatus of claim 17 wherein the glow discharge is generated by microwave power.

20. A method for filling one or more features on a substrate having a field area with a conductive material, comprising:
   (a) generating a glow discharge in an inert gas atmosphere between a target and a patterned substrate to be processed;
   (b) applying a pulsed DC bias having a DC positive voltage portion and a DC negative voltage portion to the substrate independent of a bias applied to the target to preferentially deposit a conductive material into the one or more features.

* * * * *

UNITED STATES PATENT AND TRADEMARK OFFICE
CERTIFICATE OF CORRECTION

PATENT NO.  : 6,051,114

Page 1 of 2

DATED       : April 18, 2000

INVENTOR(S) : Yao et al.

It is certified that error appears in the above-identified patent and that said Letters Patent is hereby corrected as shown below:

On the Title Page, Item [75], please replace "Sunnyvale" with -- San Francisco --.

On page 1, inventors section, please replace "Cambridge" with - Lexington --.

On page 1, other publications section, please replace "trench-lling pro les" with -- trench-filling profiles -- .

On page 2, other publications section, please replace "Noval" with -- novel --.

In column 3, line 33, after "target", please delete " - ".

In column 4, line 55, after "lattice", please delete "A".

In column 6, line 7, after "therein", please insert a -- . -- .

In column 7, line 55, before "various", please replace "he" with -- the --.

UNITED STATES PATENT AND TRADEMARK OFFICE
CERTIFICATE OF CORRECTION

PATENT NO. : 6,051,114
DATED : April 18, 2000
INVENTOR(S) : Yao et al.

It is certified that error appears in the above-identified patent and that said Letters Patent is hereby corrected as shown below:

In column 8, line 42, after "parameters", please delete "C.".

In column 10, line 24, please replace "1.5" with -- 5 --.

In column 10, line 31, after "target", please replace ":" with -- ; --.

In column 11, line 8, please replace "1.5" with -- 5 --.

Signed and Sealed this

Twenty-seventh Day of March, 2001

*Attest:*

NICHOLAS P. GODICI

*Attesting Officer*  Acting Director of the United States Patent and Trademark Office